United States Patent [19]

Chambers

[11] 4,127,425
[45] Nov. 28, 1978

[54] LUMINESCENT SOLAR COLLECTOR

[75] Inventor: Robert R. Chambers, Studio City, Calif.

[73] Assignee: Atlantic Richfield Company, Los Angeles, Calif.

[21] Appl. No.: 892,366

[22] Filed: Mar. 31, 1978

[51] Int. Cl.² ............................................. H01L 31/04
[52] U.S. Cl. ............................ 136/89 PC; 136/89 HY
[58] Field of Search ..................... 136/89 PC, 89 HY; 250/227

[56] References Cited

U.S. PATENT DOCUMENTS

| 4,029,519 | 6/1977 | Schertz et al. | 136/89 PC |
| 4,074,704 | 2/1978 | Gellert | 126/270 |
| 4,078,547 | 3/1978 | Malacek | 126/271 |

FOREIGN PATENT DOCUMENTS 2,501,907 7/1976 Fed. Rep. of Germany ...... 136/89 PC

OTHER PUBLICATIONS

P. B. Mauer et al., "Fluorescent Concentrator for Solar Energy Collection", Research Disclosure, Jan. 1976, p. 20.

W. H. Weber et al., "Luminescent Greenhouse Collector for Solar Radiation", Applied Optics, vol. 15, pp. 2299-2300 (1976).

Primary Examiner—John H. Mack
Assistant Examiner—Aaron Weisstuch
Attorney, Agent, or Firm—Robert M. Betz

[57] ABSTRACT

A thin, luminescent sheet having upper and lower large area surfaces separated by upstanding edge faces, said sheet being contoured in the vicinity of at least one of said edge faces so as to widen such edge face substantially, and at least one photovoltaic cell carried on and occupying a substantial portion of such widened edge face.

12 Claims, 5 Drawing Figures

LUMINESCENT SOLAR COLLECTOR

BACKGROUND OF THE INVENTION

1. Field of the Invention

This invention relates generally to apparatus for converting solar energy to electricity by means of solar cells and more particularly to apparatus of this type which more efficiently collects and concentrates available sunlight for utilization by such cells.

2. Description of the Prior Art

It is well known that a photovoltaic semiconductor p-n junction can convert to electricity only that portion of the incident photon energy spectrum, typically solar radiation, which creates hole-electron pairs within a given semiconductor material. Thus, for example, in a silicon photocell only that portion of the solar spectrum with energy in the vicinity of 1.1 electron volts per photon is converted into electricity. Photons of lesser energy are not absorbed at all. More energetic photons are strongly absorbed and are wasted in heating the cell, which further degrades its energy conversion efficiency. Clearly, therefore, to maximize the efficiency of a given photovoltaic cell, it is advantageous to convert as much of the available light as possible into an energy range to which such cell can usefully respond before the light strikes the cell's surface.

An existing technique for achieving such conversion takes advantage of the fact that light falling upon a luminescent material or agent is characteristically re-radiated or emitted in a narrow band of wavelengths of known energy content. Also, light absorbed by such a material in one direction is scattered in many directions. Such agents include, for example, organic dyes which are used in scintillation counters, lasers and the like. For the purposes of this application the term "luminescent agent" is understood to include materials exhibiting all species of luminescence, including but not limited to fluorescence and phosphorescence.

It has been shown that a dispersal of such luminescent materials within an internally reflective sheet of transparent glass or plastic, one of whose major surfaces is exposed to the sun, concentrates and focuses a flux of light of known energy level toward one or more of the upstanding edge faces of such sheet. If a photovoltaic cell responsive only to light at that energy level is placed against or optically coupled to such edge face, the energy conversion efficiency of the cell increases several times. In this application a light-transmissive sheet of such construction and properties is termed a "luminescent sheet" and a photovoltaic solar collector employing such a sheet is termed a "luminescent solar collector". A luminescent solar collector of this type is fully and completely disclosed and applied in Optics, Vol. 15, No. 10, pp. 2290-2300, dated October 1976, the disclosure of which is incorporated herein by reference.

A thin, luminescent sheet of the type described produces a high multiplication of incident light intensity on an edge-mounted solar cell because of the relatively small area of an edge face in relation to the larger area exposed to the sun. For example, for a luminescent sheet 2 feet square and one-eighth inch thick, this multiplication factor is approximately 200 to 1 if three edge faces are silvered. This light intensification theoretically enables one to increase solar cell power output per unit surface area by the same factor.

This greater light intensity may, however, result in correspondingly increased cell temperature either because of the relatively greater heating effect of high energy photons or as a result of IR heating under load conditions. If this temperature rises significantly, external cooling means may become necessary to avoid serious degradation of cell efficiency.

In addition, a certain amount of the available surface area of the cell facing the edge face of a luminescent sheet must be occupied by conductive elements for making connections between the cell and an external load circuit. Such conductors block the passage of useful radiation into the cell. The smaller the total cell surface area, the greater is the proportionate loss of total received light energy for conductors of a given size and current carrying capability.

Finally, as the edge face surface area becomes sufficiently small, it is no longer feasible to employ edge-mounted solar cells of conventional design and size.

One solution to the potential problems outlined above might be simply to increase the entire thickness of the luminescent sheet. This has the drawback, however, of increasing the weight and cost per unit area of the sheet to a point which may become uneconomic.

SUMMARY OF THE INVENTION

It is therefore a general object of this invention to provide a new and improved photovoltaic solar collector employing a luminescent sheet.

It is a more specific object of this invention to provide a luminescent solar collector of greater versatility under a variety of operating conditions.

It is a still more specific object of this invention to provide a luminescent solar collector employing a thin, luminescent sheet of substantially constant thickness which may be optically coupled to edge-mounted solar cells of varying size.

In accordance with this invention, the upper and lower surfaces of a luminescent sheet are flared apart of otherwise contoured in the vicinity of at least one of its upstanding edge faces so as to substantially widen such edge face and increase its surface area. At least one photovoltaic cell is carried on said widened edge face for receiving the light flux concentrated thereon.

Other objects and advantages of this invention will become apparent from a consideration of the detailed description to follow taken in conjunction with the figures and the appended claims.

DESCRIPTION OF THE PREFERRED EMBODIMENTS

Figure 1:
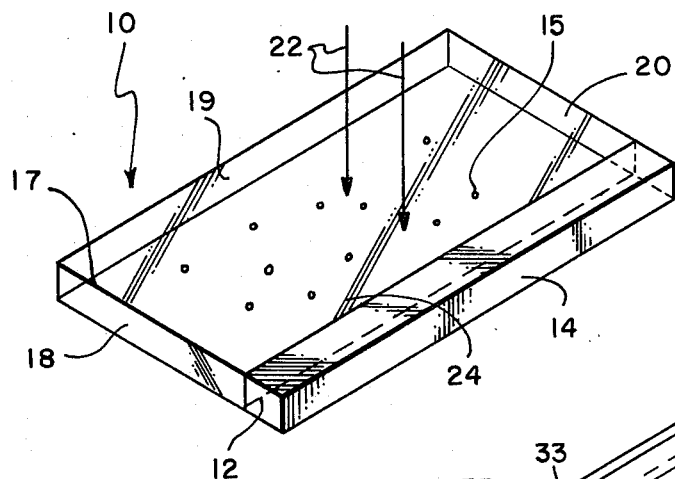
FIG. 1 shows a prior art luminescent solar collector.

FIG. 1 shows a prior art luminescent solar collector consisting of a planar luminescent sheet 10, one upstanding edge face 12 of which is substantially covered by a solar cell 14. Sheet 10 is composed of a matrix material impregnated with one or more luminescent agents represented diagrammatically by dots 15. The bottom surface 17 and the remaining three upstanding edge faces 18, 19 and 20 may be mirrored for high reflectance.

In accordance with the prior art teachings, a ray of sunlight represented by any of arrows 22 impinges on the transparent, polished upper surface 24 and passes into the interior of the luminescent sheet 10. When the ray 22 impacts a luminescent agent 15, it is partially absorbed and re-emitted in a narrow wavelength band efficiently usable by the photovoltaic cell 14. This re-emitted light is scattered in many directions, which increases the probability of internal reflection. With successive reflections of these re-emitted rays, it has been established that an intense flux of light at the desired wavelength is funneled to the edge 12 where it impinges on the photocell 14 and stimulates the desired energy conversion.

According to the teachings of this invention, means are devised for enlarging the solar cell-carrying edge face area of a luminescent sheet such as described in FIG. 1 without affecting the overall thickness of the sheet.

Figure 2:
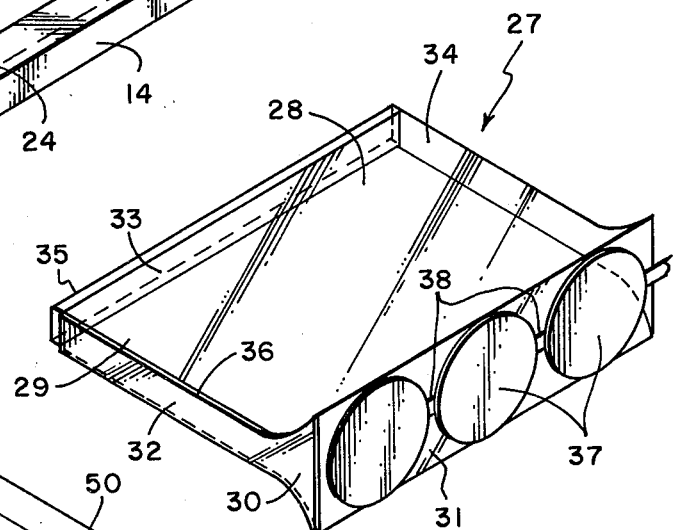
FIG. 2 is a device in accordance with a preferred embodiment of this invention.

FIG. 2 shows a solar collector in accordance with a preferred embodiment of the invention employing a luminescent sheet 27. Upper and lower surfaces 28 and 29 are spread apart adjacent one end of sheet 27 to form an upwardly and downwardly projecting flange portion 30 which defines the significantly widened, upstanding edge face 31. Edge faces 32, 33 and 34 and lower surface 29 are made suitably reflectant so that all the light incident on upper surface 28 is concentrated and focused in the direction of the face 31. One or more of edge faces 32, 33 and 34 can be covered with a mirror, e.g., mirror 35 on face 33, or other reflecting medium or with a diffusive medium, e.g., white plastic coating 36 on face 32, to break up the incident light to maximize internal reflection. Positioned in adherent, contiguous contact with edge face 31 are one or more photocells 37 which for purposes of illustration are shown to be of circular configuration. It will be understood however that within the scope of this invention the cells 37 may be shaped by wellknown means to further enlarge the percentage of the available area of the edge face 31 covered thereby.

Light in a desired energy band generated by luminescent sheet 27 will now distribute itself over the enlarged surface area of the edge face 31 and the correspondingly enlarged surface area of cells 37. Cells 37 are thereupon stimulated to provide an electrical output through conventional conductors 38 as shown. In this manner one may couple the edge-directed light energy of a thin, luminescent sheet into solar cells of significantly greater size than taught by prior art practice.

For purposes of illustration, the size of flange portion 30 in relation to the sheet 27 has been exaggerated. As an example, sheet 27 is 2 feet square and one/eighth inch thick. Flange 30 begins one/fourth inch from edge face 31 or approximately one/hundredths of the length of edge face 31. Further in this example, the surface 31 is widened to four times the overall thickness of sheet 27, i.e. one/half inch, so that its area is approximately four times that of the area of the surface of edge faces 32, 33 and 34. Thus, the total area of cells 37 may also be increased by a factor of four. The enlarged cells 37 will therefore tend to operate at a lower temperature, without any loss in power output. Further, conductive elements of any given size and capacity (not shown) on the surface of cells 37 contiguous with face 31 will clearly occupy a much smaller percentage of such area than would be the case if such cells were placed on an unaltered edge face such as edge face 33.

The size and shape of flange 30 and the thickness of enlarged edge face 31 may be varied in accordance with factors such as cell characteristics, cell cost per unit area, expected average light intensity, external cell cooling means, power requirements, physical installation limitations, and the like. Those skilled in this art will have no difficulty in assigning appropriate weight to such factors in designing a luminescent solar collector in accordance with this invention.

Figure 3:
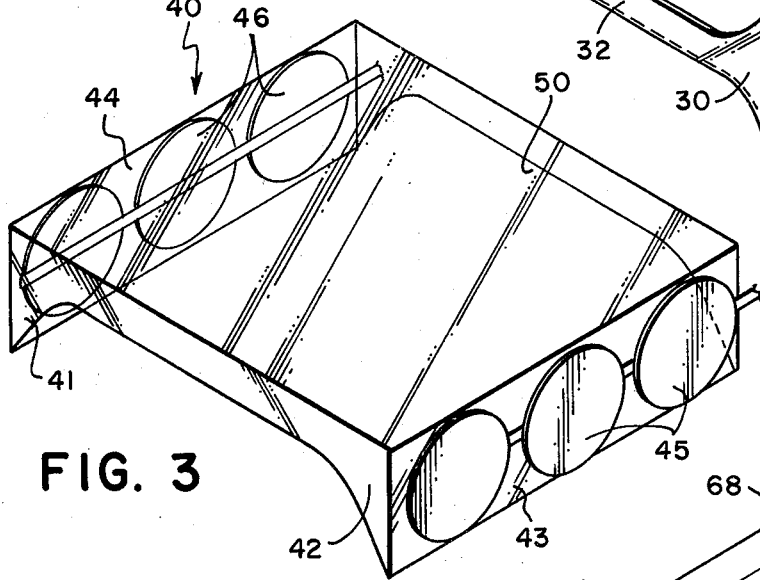
FIG. 3 is a device in accordance with an alternate embodiment of this invention.

In FIG. 3, an alternate form of light transmissive luminescent sheet 40 is provided with downwardly projecting smoothly contoured flange portions 41 and 42 in the vicinity of opposing edge faces 43 and 44 against which are positioned like pluralities of photocells 45 and 46. Light incident on upper surface 50 of sheet 40, through the mechanism previously described, is focused toward both widened edge face 43 and widened edge 44, thus stimulating cells 45 and 46. In this case, the available light flux on surface 50 will be divided equally between the opposing edge faces 43 and 44. Thus, in this embodiment of FIG. 3, the increased surface area available for solar cell placement is further enhanced by employing two edge faces instead of one.

Figure 4:
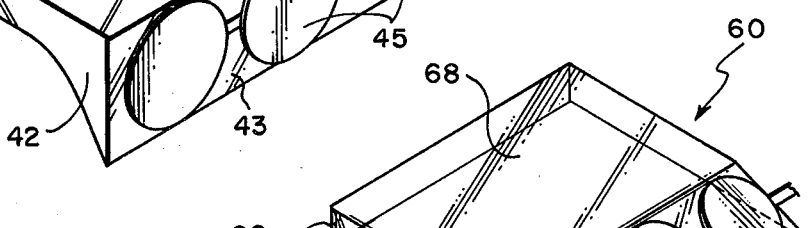
FIG. 4 is a device in accordance with another alternate embodiment of this invention.

Yet another alternate form of this invention is shown in the device of FIG. 4 employing a luminescent sheet 60, one edge face 61 of which has been beveled at a substantial angle to the normal upstanding edge face 62 at the opposite end of the sheet 60. For example, if this angle is sixty degrees, the surface area of the edge face 61 becomes double that of the normal edge face 62. A plurality of photocells 64 positioned against the edge face 61 are enabled to receive and efficiently convert concentrated light flux responsive to light incident on the upper surface 68 in accordance with the teachings of this invention. In this embodiment the areas of edge face 61 not covered by cells 64 may also admit incident sunlight into sheet 60.

Figure 5:
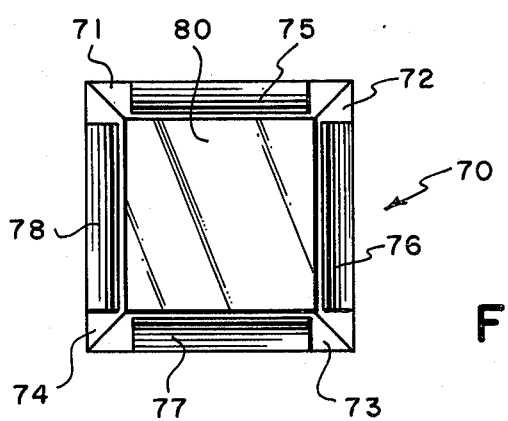
FIG. 5 is a device in accordance with a still further alternate embodiment of this invention.

In yet another device in accordance with this invention, the configuration of FIG. 4 may be used repetitively in the formation of luminescent sheet 70 having four beveled edge faces 71, 72, 73 and 74. Such edge faces will respectively accommodate photocells 75, 76, 77 and 78, which for purposes of convenience are shown to be rectangular. Obviously, within the scope of the invention, they may be circular or of other intermediate shape. In the device of FIG. 5, light incident upon the upper surface 80 and upon the uncovered portions of edge faces 71-74 may be focused intensely at a desired wavelength and energy level in four separate divergent directions, thereby stimulating the cells 75-78 for efficient energy conversion.

The luminescent sheets shown in FIGS. 2-5 may be made of glass or polymeric material or other transparent material into which luminescent agents can be incorporated and dispersed by well-known means, so long as the matrix material can be cast, molded, or cut into the indicated geometric shapes. The luminescent materials may include commercially available metals, oxides, or other metallic compounds whose characteristics are well known to the art. Such materials include, for example, neodymium oxide in a glass matrix or laser dyes from the coumarin or rhodamine families. Within the scope of this invention, the luminescent agents employed may either emit light directly or by way of cascading which approaches the desired energy range for a specfic type of photovoltaic cell.

Photovoltaic cells which may be used in the practice of this invention may include silicon, cadmium sulfide, gallium arsenide and many semiconductor materials well known to the art. As previously pointed out, the photovoltaic cells to be employed in this invention are not limited as to size or shape or configuration or precise placement upon the enlarged surfaces of the edge faces toward which light flux is directed. Any suitably adherent means are acceptable for applying the cells to the edge faces of the various luminescent sheets.

A goal of this invention is to provide enlarged surface areas for placement of solar cells covering the edge faces of a light concentrating, luminescent sheet without disturbing the essential thickness or configuration of the sheet. Within the scope of this invention many variations are permissible in the precise geometric shapes which form the desired edge or peripheral modifications.

The embodiments of the invention in which an exclusive property or privilege is claimed are defined as follows.

1. In a luminescent solar collector wherein a luminescent sheet having upper and lower surfaces separated by a plurality of upstanding edge faces focuses light on at least one photovoltaic cell at least partially covering at least one of said faces, the improvement wherein said sheet is contoured in the vicinity of each such covered edge face so that the width of same between said upper and lower surfaces is substantially greater than the thickness of said sheet diatal from each said covered edge face.

2. A device according to claim 1 wherein said at least one photovoltaic cell covers a substantial portion of each said widened edge face.

3. A device according to claim 1 wherein said sheet is contoured by spreading said upper and lower surfaces apart from other to form an upstanding flange portion of said sheet which defines said widened edge face.

4. A device according to claim 3 wherein said upstanding flange portion extends both above and below said sheet.

5. A device according to claim 3 wherein said upstanding flange portion lies entirely on one side of said sheet.

6. A device according to claim 1 wherein said sheet is essentially rectangular.

7. A device according to claim 1 wherein said upper and lower surfaces are essentially parallel except for said contoured portion thereof.

8. A device according to claim 1 wherein at least one of said edge faces is reflective.

9. A device according to claim 1 wherein said wider edge face is beveled with respect to said upper and lower surfaces.

10. A device according to claim 9 wherein said beveled edge face is partially covered by said at least one photovoltaic cell and admits sunlight into said luminescent sheet through the portions thereof uncovered by said at least one photovoltaic cell.

11. A device accordance to claim 1 wherein the remaining edge faces which do not carry a photovoltaic cell are covered with a reflective medium.

12. A device according to claim 1 wherein the remaining edge faces which do not carry a photovoltaic cell are covered with a diffusive medium.

* * * * *

UNITED STATES PATENT OFFICE
CERTIFICATE OF CORRECTION

PATENT NO. : 4,127,425
DATED : November 28, 1978
INVENTOR(S) : Robert R. Chambers It is certified that error appears in the above-identified patent and that said Letters Patent are hereby corrected as shown below:

Col. 1, line 55, "2290" should be --2299--.

Col. 1, line 62, "one-eight" should be --one/eighth--.

Col. 2, line 38, "of" second occurrence should be -- or --.

Col. 3, line 41, "wellknown" should be --well known--.

Col. 3, line 57, "one/hundredths" should be --one/one-hundredths--.

Col. 5, line 3 "many" should be --many other--.

Col. 5, line 29 "said faces" should be --said edge faces--.

Col. 5, line 34 "diatal" should be --distal--.

Col. 6, line 6, "from other" should be --from each other--.

Signed and Sealed this

Twenty-fourth Day of April 1979

[SEAL]

Attest:

RUTH C. MASON
Attesting Officer

DONALD W. BANNER
Commissioner of Patents and Trademarks